US006924665B2

(12) United States Patent
Nakajima et al.

(10) Patent No.: US 6,924,665 B2
(45) Date of Patent: Aug. 2, 2005

(54) LOGIC DEVICE RE-PROGRAMMABLE WITHOUT TERMINATING OPERATION

(75) Inventors: Mitsurou Nakajima, Kawasaki (JP); Takayasu Mochida, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 6 days.

(21) Appl. No.: 10/759,956

(22) Filed: Jan. 16, 2004

(65) Prior Publication Data

US 2004/0174186 A1 Sep. 9, 2004

(30) Foreign Application Priority Data

Mar. 5, 2003 (JP) ........................................ 2003-058525

(51) Int. Cl.[7] .............................................. H03K 19/177
(52) U.S. Cl. .............................. 326/39; 326/38; 326/40; 365/189.01; 365/189.04; 365/230.01
(58) Field of Search ................. 326/38–41; 365/189.01, 365/189.04, 230.01, 230.06, 189.08, 230.03, 230.08

(56) References Cited

U.S. PATENT DOCUMENTS 5,550,782 A * 8/1996 Cliff et al. ............. 365/230.03
5,559,450 A * 9/1996 Ngai et al. ..................... 326/40

FOREIGN PATENT DOCUMENTS

JP     11-243334      9/1998

* cited by examiner

Primary Examiner—Vibol Tan
(74) Attorney, Agent, or Firm—Katten Muchin Zavis Rosenman

(57) ABSTRACT

A logic device re-programmable without terminating operation. In the logic device, a logic circuit is configured and maintained based on logic circuit configuration data for implementing a desired function. The logic device comprises: a memory holding the logic circuit configuration data for configuring and maintaining the logic circuit; and an address controller for writing, in an unused area of the memory, logic circuit configuration data for configuring and maintaining one or more additional logic circuits without terminating operation of the logic device. It is an object of the present invention to provide a logic device in which data re-writing, such as addition of functions and correction of problems, is available as required, without terminating operation of the device.

2 Claims, 14 Drawing Sheets

LOGIC DEVICE RE-PROGRAMMABLE WITHOUT TERMINATING OPERATION

BACKGROUND OF THE INVENTION

1. Field of the Invention

The present invention relates to a logic device which is re-programmable during its operation. For instance, the invention relates to a logic device, such as a Field Programmable Gate Array (FPGA), suitable for use in exchanges, whose system down should be avoided. The invention makes it possible to add new functions in such exchanges, and also makes it possible to correct any failures occurring in the exchanges without termination operation.

2. Description of the Related Art

FPGAs are Application Specific Integrated Circuits (ASICs) whose functions can be defined by users. The FPGAs are formed of more than one logic circuit (Configurable Logic Block; CLB) including multiple logic components (AND gates and OR gates, or the like), with a sufficient degree of integration. Those logic components and CLBs are combined, in accordance with programs, to perform a variety of functions.

FIG. 14 shows an FPGA having a construction of a conventional logic device. An FPGA 100 in FIG. 14 performs an operation called "configuration" soon after power is turned on, to obtain circuit configuration and maintenance data (CLB configuration data) from an external device (microprocessor or the like) for configuring and maintaining CLBs (circuit configuration units) 103, which perform specific functions, in the FPGA, and to store the obtained data in the memory 102, such as a RAM.

In this memory 102, required pieces of circuit configuration and maintenance data, each corresponding to functions to be implemented, are stored, and based on such data, the CLBs 103 are configured and maintained in the FPGA 100 to perform the above functions. Here, apart from the above-mentioned circuit configuration and maintenance data, the memory 102 also has areas for storing data (connection net data) for wiring the CLBs 103. The CLBs 103 are also automatically connected, using unwired areas, according to the data written in the wiring data storage areas.

When circuit configuration and maintenance data is written in the memory 102 in a conventional device, the address counter 101 writes the data sequentially, starting from the first address of the memory 102, since there is no concept of addresses. If some memory addresses (unused areas) are empty (unused), data indicating that the corresponding CLBs are non-configured (unused) is written therein.

Further, the following patent document 1 shows another technique in another conventional FPGA. This technique provides the FPGA with memory circuits (RAM modules 10 in FIGS. 1 and 2 of the following patent document 1) which selectively operate as a Random Access Memory or a device to perform a product-term (P term) logic, thus facilitating execution of logic functions having multiple inputs. In this technique, one of the foregoing RAM modules 10 serves as a function of one of the CLBs 103 of the FPGA 100 of FIG. 14.

[Patent Document 1]

Japanese Patent Application Laid Open No. HEI 11-243334

In the foregoing conventional FPGAs, however, it is impossible to write circuit configuration and maintenance data in arbitrary addresses specified in the memory 102 which is provided for deciding (configuring and maintaining) the CLBs 103. Therefore, if an additional function needs to be added or a problem in the device needs to be solved, the device is required to be turned off once, and then turned on again, so that all the circuit configuration and maintenance data is reset before rewriting is performed. In this instance, although it is also possible to repeat the configuration operation once again without turning the power off, the FPGA itself is reset (equal to turning off the power).

Accordingly, in order to add some functions in the FPGA or to correct any problems in the FPGA, system down of the corresponding functions has always been necessary, and it has been impossible to perform such processing while the system is in operation.

SUMMARY OF THE INVENTION

With the foregoing problems in view, it is an object of the present invention to provide a logic device in which data re-writing, such as addition of functions and correction of problems, is available as required, without terminating operation of the device.

In order to accomplish the above object, according to the present invention, there is provided a logic device re-programmable without terminating operation. In the logic device, a logic circuit is configured and maintained based on logic circuit configuration data for implementing a desired function. The logic device comprises a memory holding the logic circuit configuration data for configuring and maintaining the logic circuit; and an address controller for writing, in an unused area of the memory, logic circuit configuration data for configuring and maintaining one or more additional logic circuits without terminating operation of the logic device.

As a preferred feature, in case of dissatisfactory functioning of a logic circuit, the address controller writes, in the unused memory area of the memory, logic circuit configuration data for configuring and maintaining (i) a substitute logic circuit which realizes a same function of the dissatisfactory logic circuit and (ii) a switch logic circuit for switching between the dissatisfactory logic circuit and the substitute logic circuit, as the above additional logic circuits.

According to the present embodiment, as described above, the address controller specifies the unused area of the memory, which stores circuit data for configuring and maintaining logic circuits in the FPGA, and adds therein data for configuring and maintaining the additional logic circuits, thus making it possible to configure the additional logic circuits in an unused logic circuits without giving any effects on the existing CLBs in operation. Consequently, the present device is applicable in exchanges, whose system down is not allowed, so that some functions newly necessitated by service upgrade or the like can be added as required, without terminating operation of the exchange, and so that problems in logic circuits can be corrected without terminating operation of the exchanges.

DESCRIPTION OF THE PREFERRED EMBODIMENT(S)

Embodiments of the present invention are described hereinafter with reference to the relevant accompanying drawings.

Figure 1:
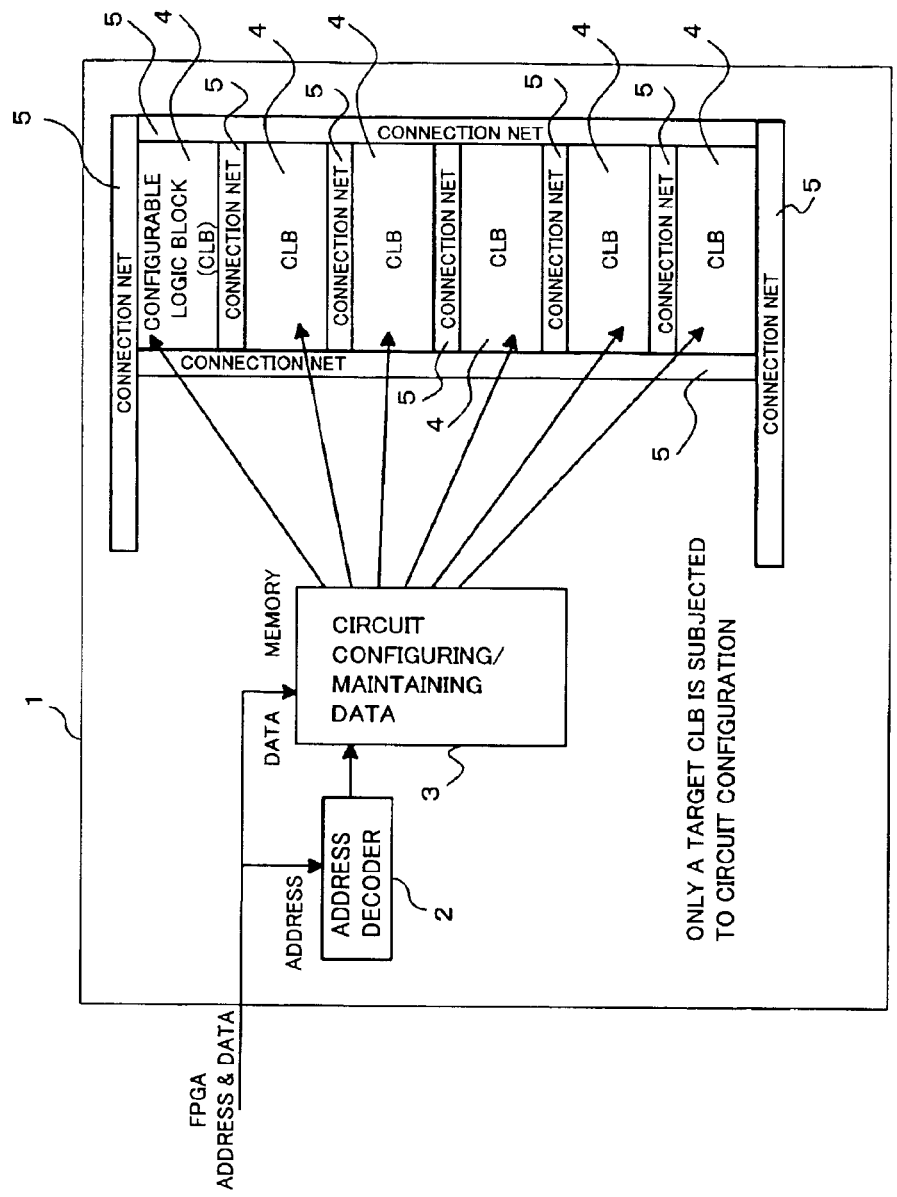
FIG. 1 is a block diagram schematically showing a Field Programmable Gate Array (FPGA; logic device) of one embodiment of the present invention.

[1] First Embodiment:

FIG. 1 shows a block diagram of an FPGA (logic device) according to one embodiment of the present invention. As shown in FIG. 1, the FPGA 1 of the embodiment, which is applicable in an exchange, has an address decoder 2, a memory (circuit decision RAM) 3, more than one logic circuit (configurable logic block: CLB) 4, and more than one connection net 5.

The memory 3 stores circuit decision data (logic circuit configuration data; hereinafter also called "circuit data") for deciding (producing [or configuring] and maintaining) CLBs 4, which implement functions required in the above exchange. As shown in FIG. 1, in this embodiment, the memory 3 stores a required number of pieces of circuit data, one for each function to be implemented by each CLB 4, thereby making it possible to configure and maintain the CLBs 4 based on their corresponding circuit data.

In other words, the CLBs 4 have the same construction formed of multiple logic components, such as ANDS, ORs, and selectors, as a default condition. On the basis of the above circuit data, these logic components are activated/inactivated and combined (connected) as appropriate, thereby implementing the required functions corresponding to the above circuit data.

As for wiring (connecting) of logic circuits (CLBs) 4, wiring data (connection net data) is written in a predetermined area (gate configuration area (will be mentioned later)) of the memory 3, and according to the wiring data, connection nets 5 are configured and maintained in unwired areas. In this manner, wiring of the CLBs 4 is automatically performed.

Figure 2:
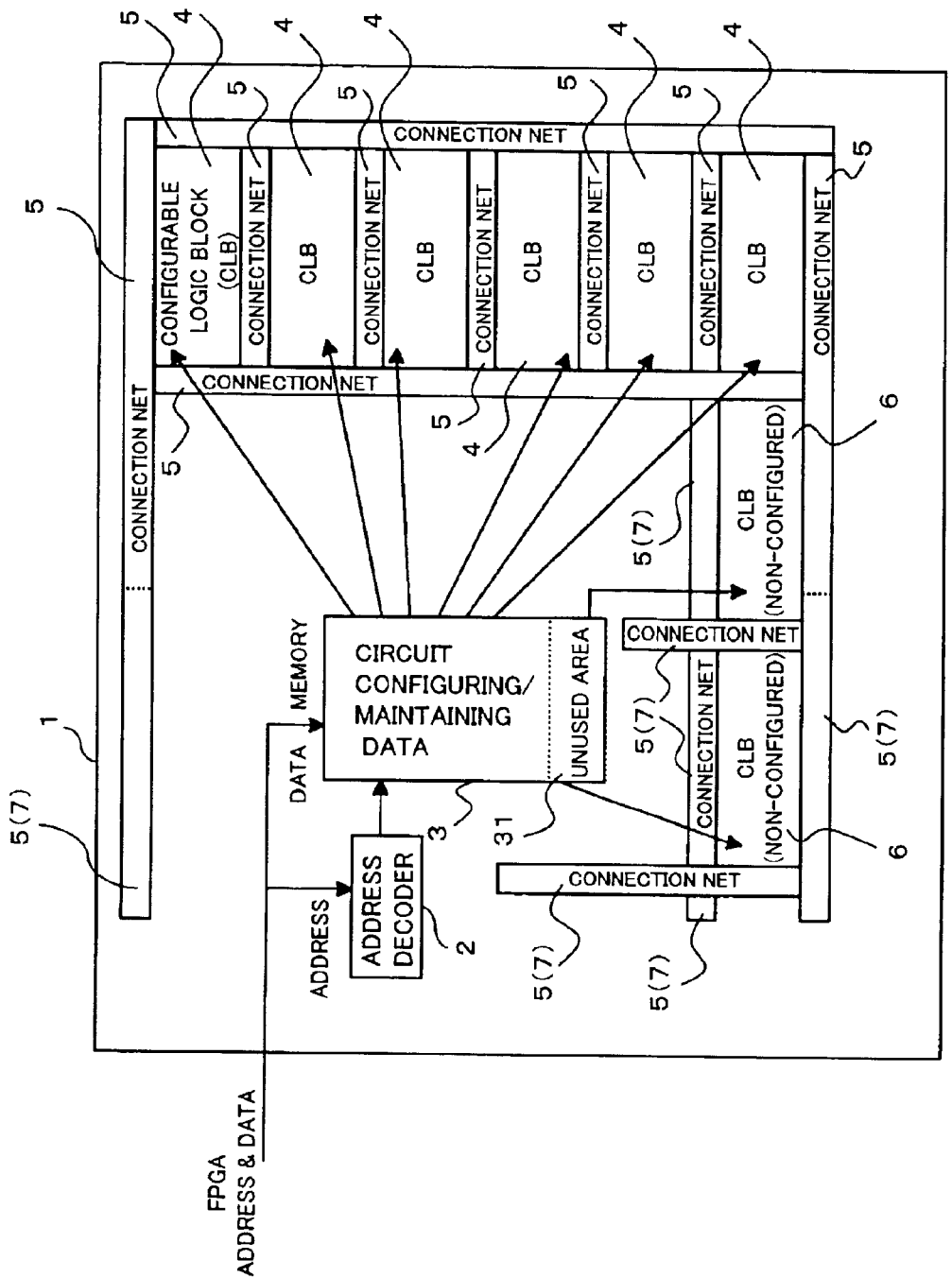
FIG. 2 is a block diagram showing how an additional logic circuit is configured and maintained in a non-configured circuit according to the construction of FIG. 1.

In addition, as shown in FIG. 2, if there is an unused memory address (unused area) 31, data (non-use data) indicating that the unused area 31 is unused (having neither circuit data nor connection net data) is written in a gate configuration data area 32 (will be described later with reference to FIGS. 3 to 6), and on the basis of the data, a required number of unused CLBs 6 and a required number of unused connection nets 7 are configured and maintained.

The address decoder (address controller) 2 receives data (address data) specifying an arbitrary memory address (hereinafter also simply called "address" or "address area") of the memory 3, from an external apparatus (an unillustrated microprocessor or the like), and writes circuit data, which is supplied also from the external apparatus (a microprocessor or the like), in the address area, which is specified by the address data, of the memory 3.

In the present FPGA 1, the address decoder 2 makes it possible to write circuit data in the specific address area of the memory 3. Accordingly, it is possible to add CLB configuration data, which is for configuring and maintaining one or more additional CLBs, in arbitrary unused areas 31 of the memory 3, so that new functions implemented by such additional CLBs are added in unused CLBs 6 corresponding to the unused areas 31, without terminating operation of other existing CLBs.

Referring now to FIGS. 3 to 6, an operation of the FPGA 1 of the present embodiment will be described hereinbelow.

Figure 3:
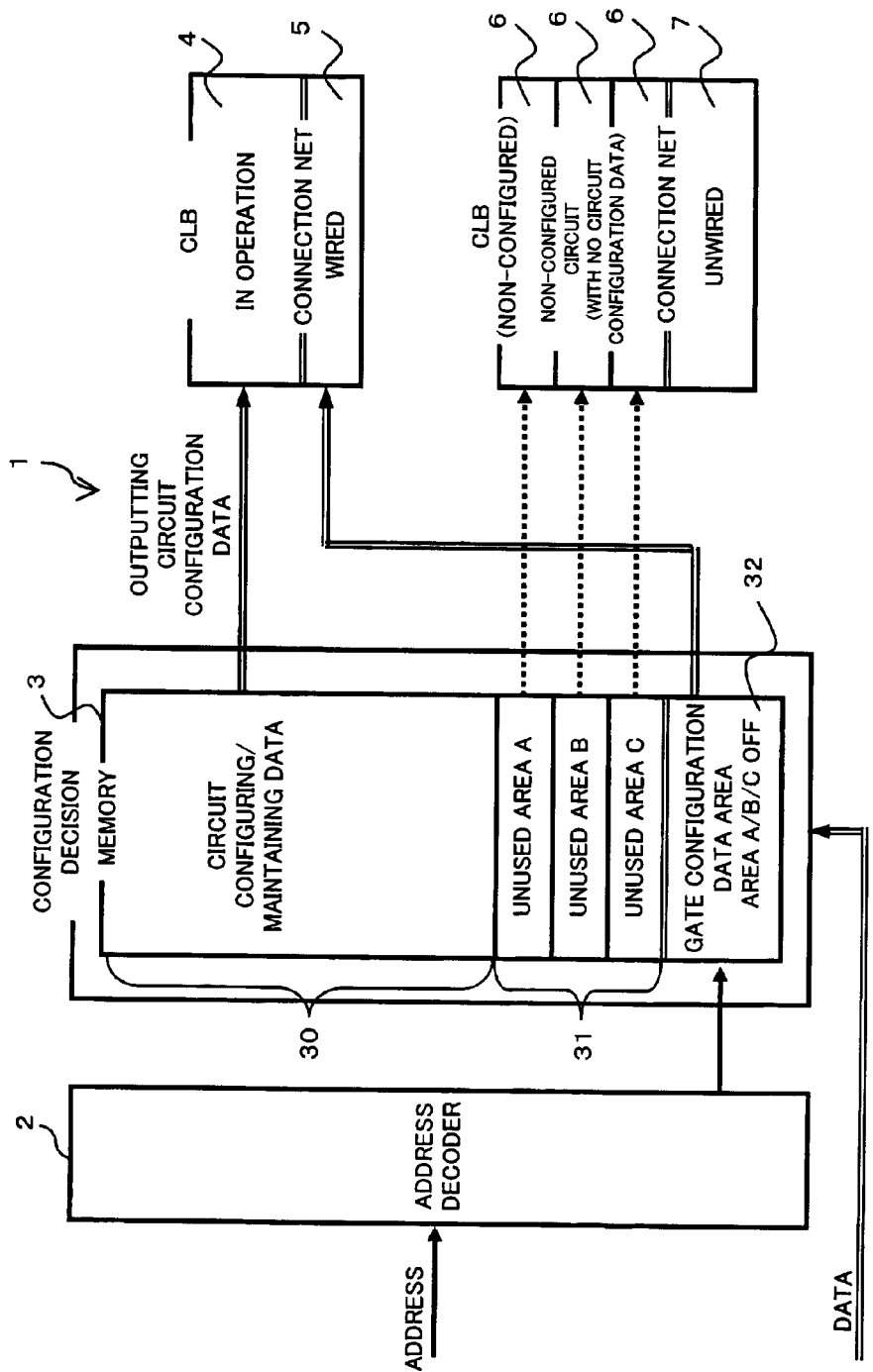
FIG. 3 is a view for describing operation (of adding a circuit) of the FPGA of FIG. 1.

First of all, as shown in FIG. 3, non-use data (data indicating that unused areas, A, B, and C, are OFF) is written in a gate configuration data area 32 of the memory 3 according to the address decoder. Here, the unused areas, A, B, and C, form the unused area 31, and those areas, A, B, and C, each have the above-mentioned non-use data, so that non-configured circuits 6 are produced in compliance with such non-use data. In this instance, another memory area 30 stores circuit data, based on which required CLBs 4 have already been configured and maintained and have been in operation.

Figure 4:
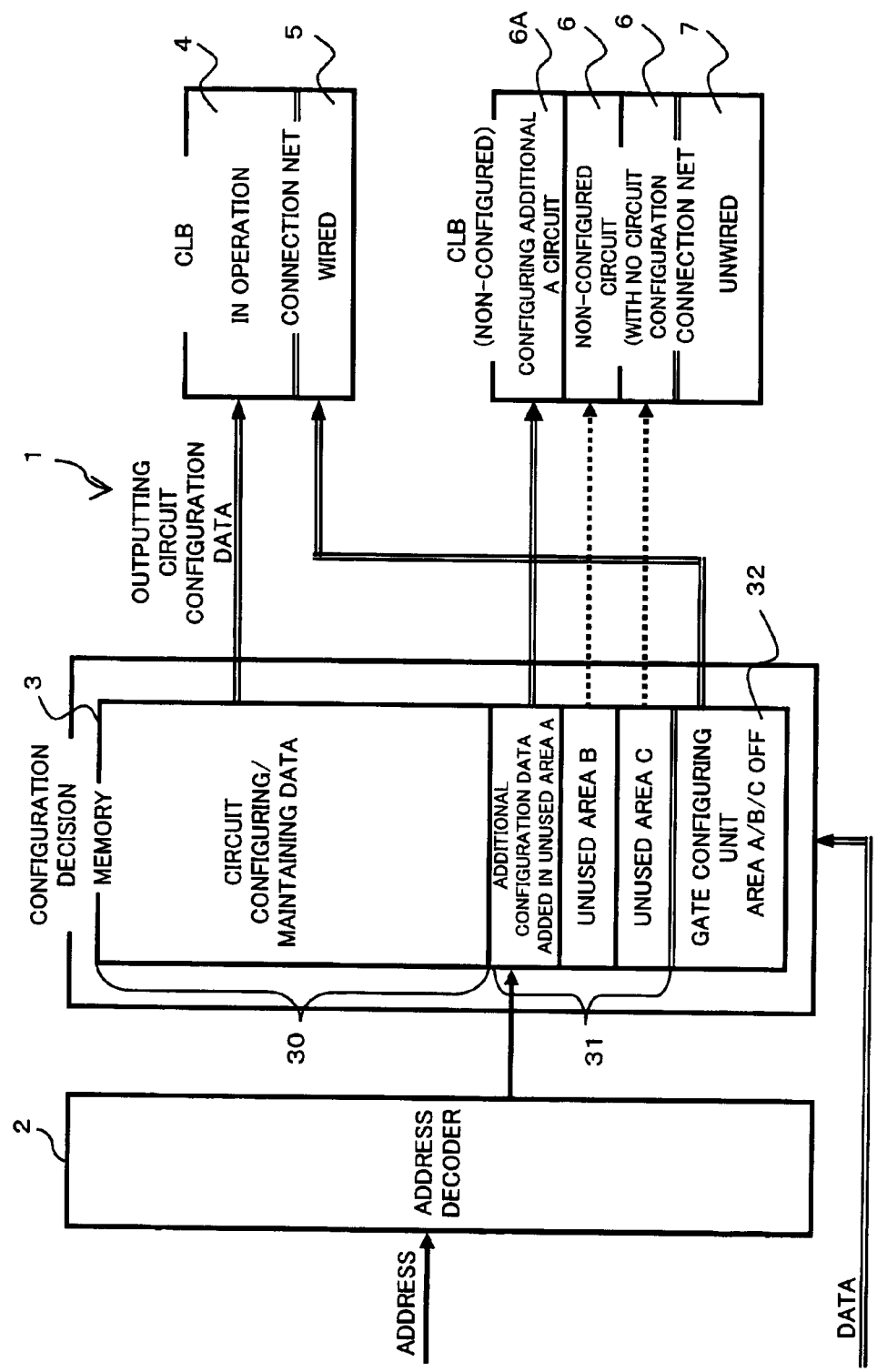
FIG. 4 is a view for describing operation (of adding a circuit) of the FPGA of FIG. 1.

Under this condition, as shown in FIG. 4, the address decoder 2 specifies the unused area A of the memory 3 to store therein circuit data for configuring and maintaining a CLB to be newly added, and based on the data, the new CLB 6A is configured and maintained in the non-configured CLB 6 that corresponds to the unused area A.

Figure 5:
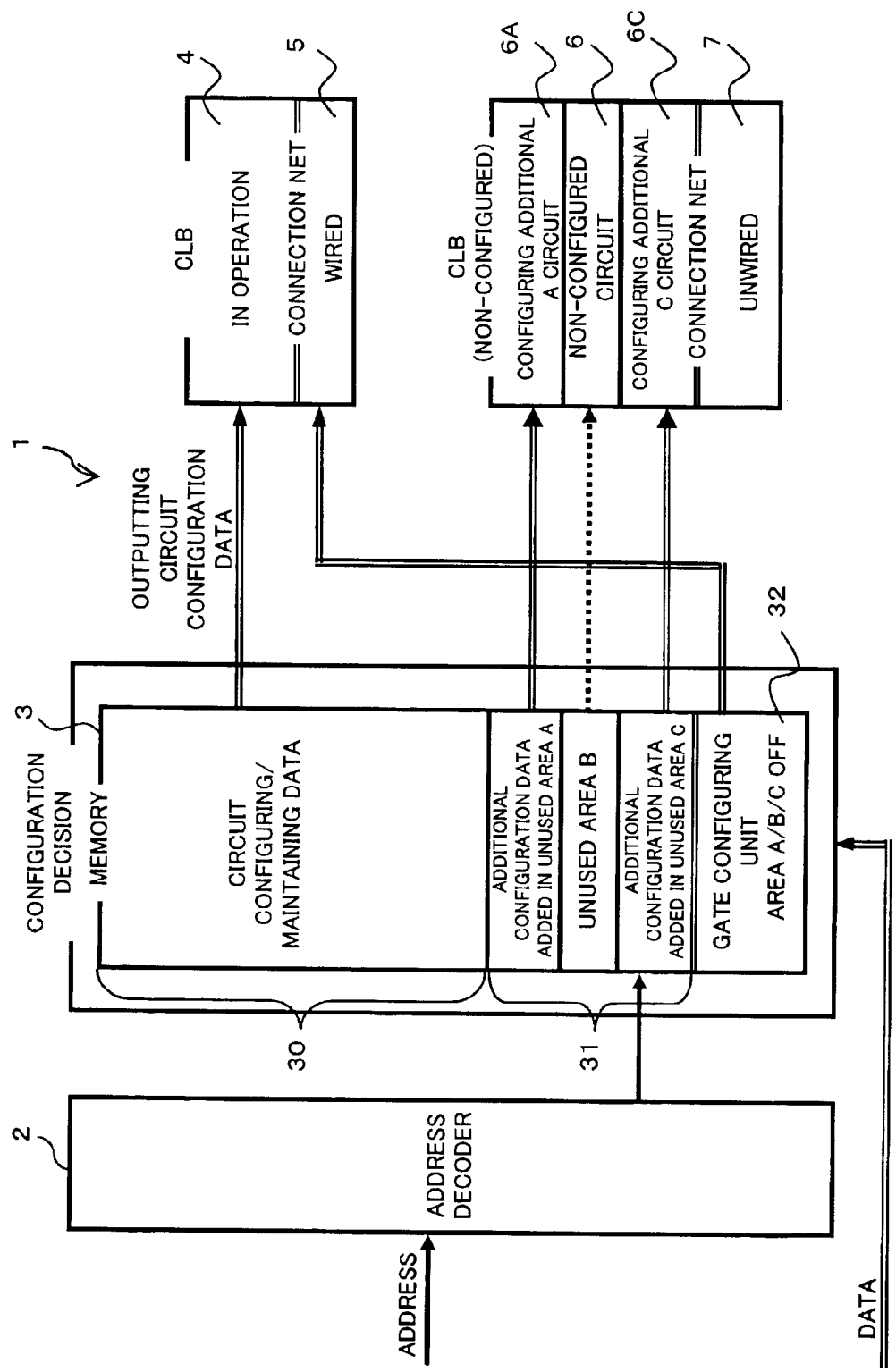
FIG. 5 is a view for describing operation (of adding a circuit) of the FPGA of FIG. 1.

Secondly, if one more additional CLB is added, the address decoder 2 specifies another unused area C of the memory 3, as shown in FIG. 5, for example, to store therein circuit data for configuring and maintaining the CLB to be newly added, and based on the data, the new CLB 6C is configured and maintained in the non-configured CLB 6 that corresponds to the unused area C.

Figure 6:
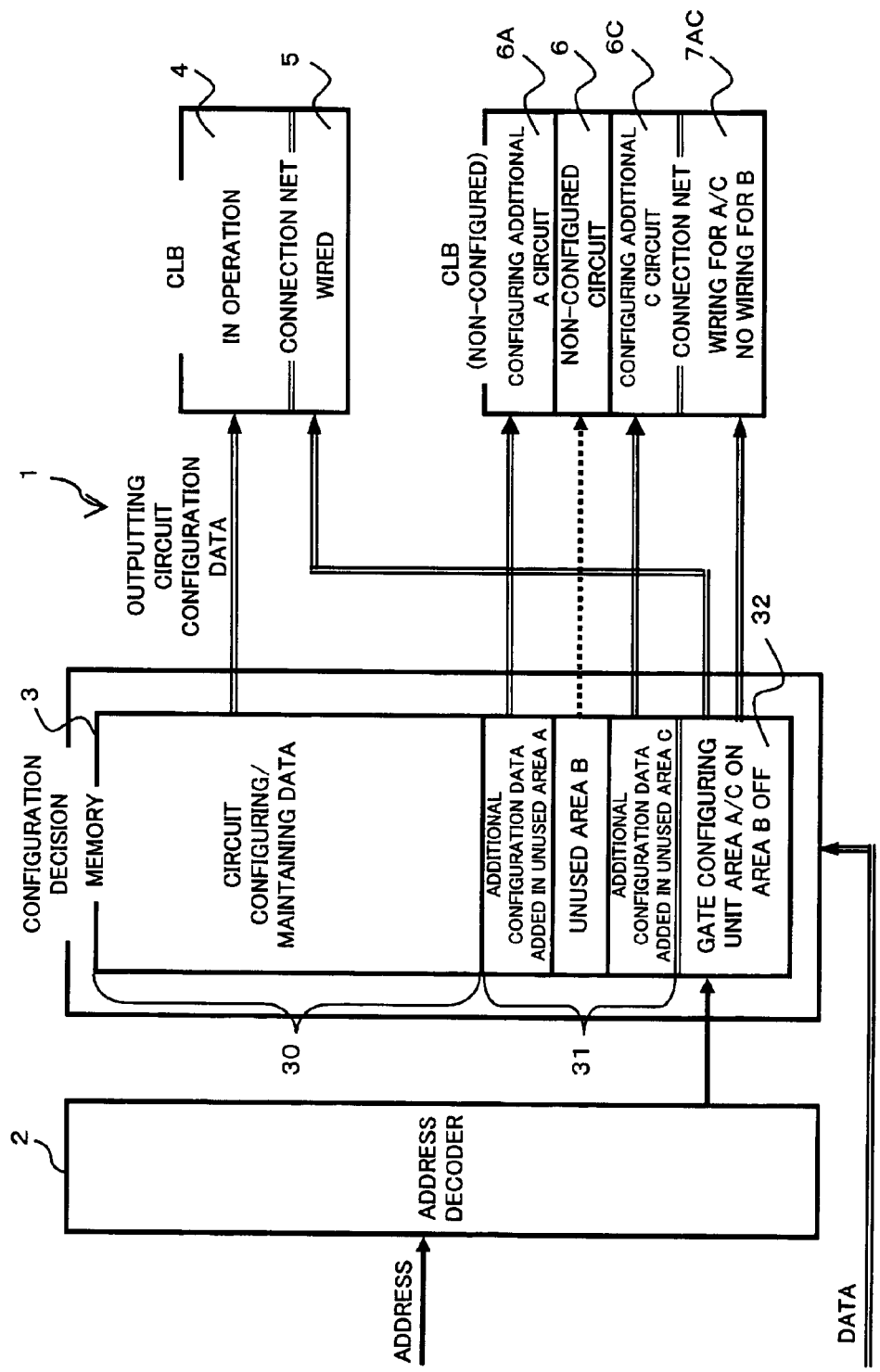
FIG. 6 is a view for describing operation (of adding a circuit) of the FPGA of FIG. 1.

As shown in FIG. 6, the address decoder 2 specifies a gate configuration data area 31 of the memory 3 to write therein data for wiring of the unused areas, A and C (the unused area B is OFF), and based on this data, a connection net 7AC for the unused areas, A and C, or the added CLBs, 6A and 6C, is configured and maintained in an unused connection net (non-wired area) 7, wiring being thereby performed.

Here, when such circuit configuration and wiring are performed for the unused area B, procedures similar to the above are also performed.

According to the present embodiment, as described above, the address decoder 2 specifies the unused area 31 of the memory 3, which stores circuit data for configuring and maintaining a CLB in the FPGA 1, and adds therein circuit data for configuring and maintaining the additional CLB, thus making it possible to configure the additional CLB in a non-configured CLB 7 without having any effect on the existing CLB 4 in operation.

Consequently, the present device is applicable in an exchange whose system down should be avoided, so that some functions newly necessitated by service upgrade or the like can be added as required, without terminating operation of the exchange.

[2] One Modified Example:

In the FPGA 1 of the present embodiment, as described above, it is possible to add new functions using non-configured CLBs 7, and thus, if a problem occurs in part of the CLBs 6, it is also possible to solve the problem without causing a system down.

Figure 7:
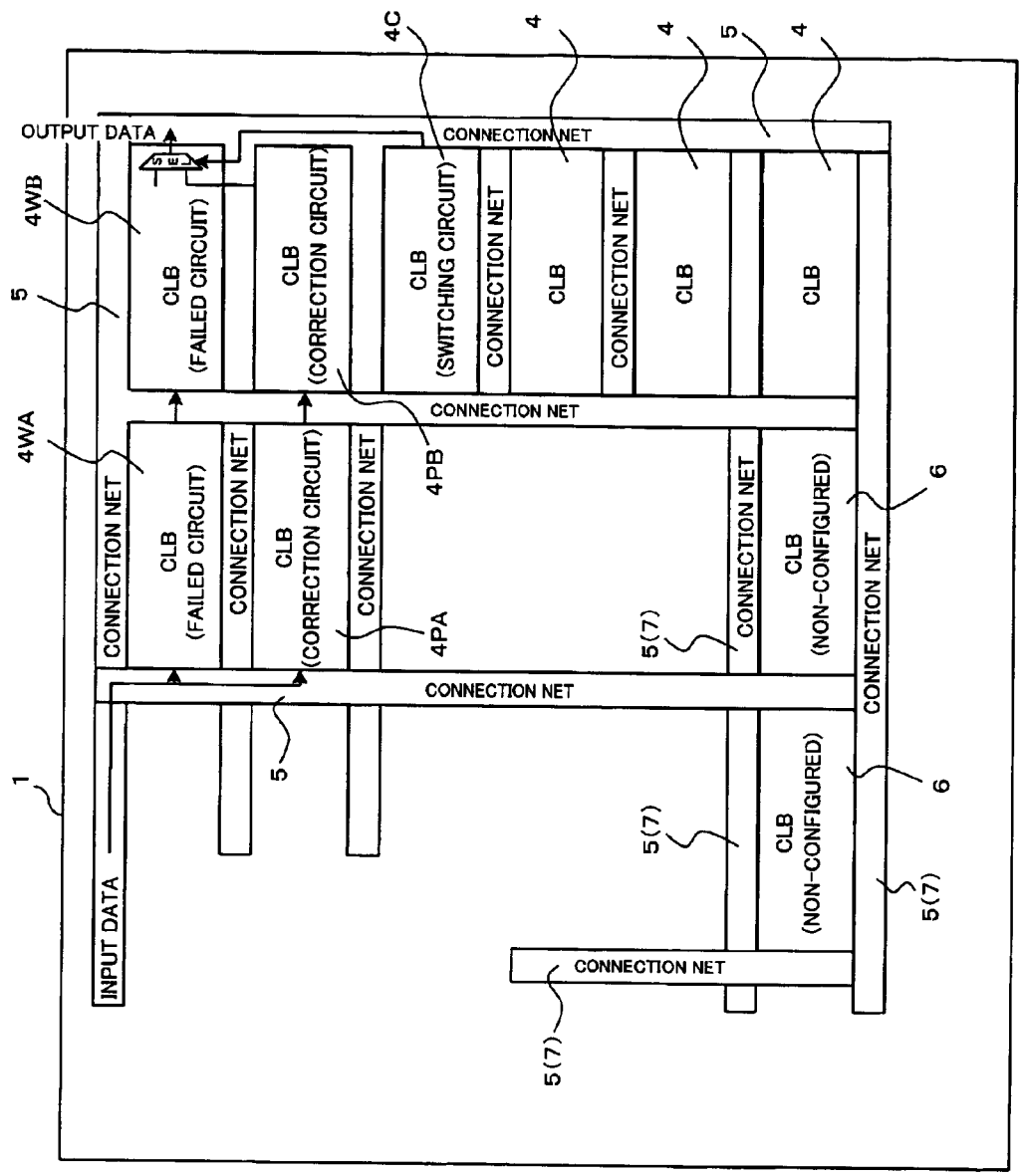
FIG. 7 is a block diagram of a modified example of the FPGA of the present embodiment.

Referring to FIG. 7, if any failure happens in CLBs, 4WA and 4WB (hereinafter also called "failed circuits"), CLBs, 4PA and 4PB (correction circuits; substitution CLBs), having the same functions as those of the CLBs, 4WA and 4WB, are newly configured and maintained in non-configured CLBs 6 in accordance with a technique similar to the above-described embodiment. In addition, a CLB (switch circuit) 4C for switching (replacing) a pair of failed circuits, 4WA and 4WB, to a pair of added correction circuits, 4PA and 4PB, is also configured and maintained in other non-configured CLBs 6.

In this manner, even if part of the CLBs 4 in the FPGA 1 experiences failure, it is possible to replace the failed circuits, 4WA and 4WB, with the correction circuits, 4PA and 4PB, which are newly configured in the non-configured circuits 6, without terminating operation of the other CLBs having no failure, which are in operation.

In this case, however, when the correction circuits, 4PA and 4PB, are activated, the switching needs to be performed in such a condition that operation timing of the failed circuits, 4WA and 4WB, matches that of the correction circuits, 4PA and 4PB. Because of their failure, however, operation timing of the failed circuits, 4WA and 4WB, cannot match that of the correction circuits, 4PA and 4PB.

In consideration of this, the correction circuits, 4PA and 4PB, are activated in a manner shown in FIGS. 8 to 13. In these FIGS. 8 to 13, addresses (areas) of the memory 3 in which data for configuring and maintaining CLBs of the FPGA 1 is stored, are labeled as addresses, "1A," "1B," "1C," "1D," "2A," "2B," "2C," "2D," "3A," "3B," "3C," and "3D" (starting from the CLB at the upper-left corner of the pictures and proceeding downward). In FIGS. 10 to 13, the correction circuit 4PA is not illustrated for convenience of description, so that the description can be concentrated on the correction circuit 4PB.

Figure 8:
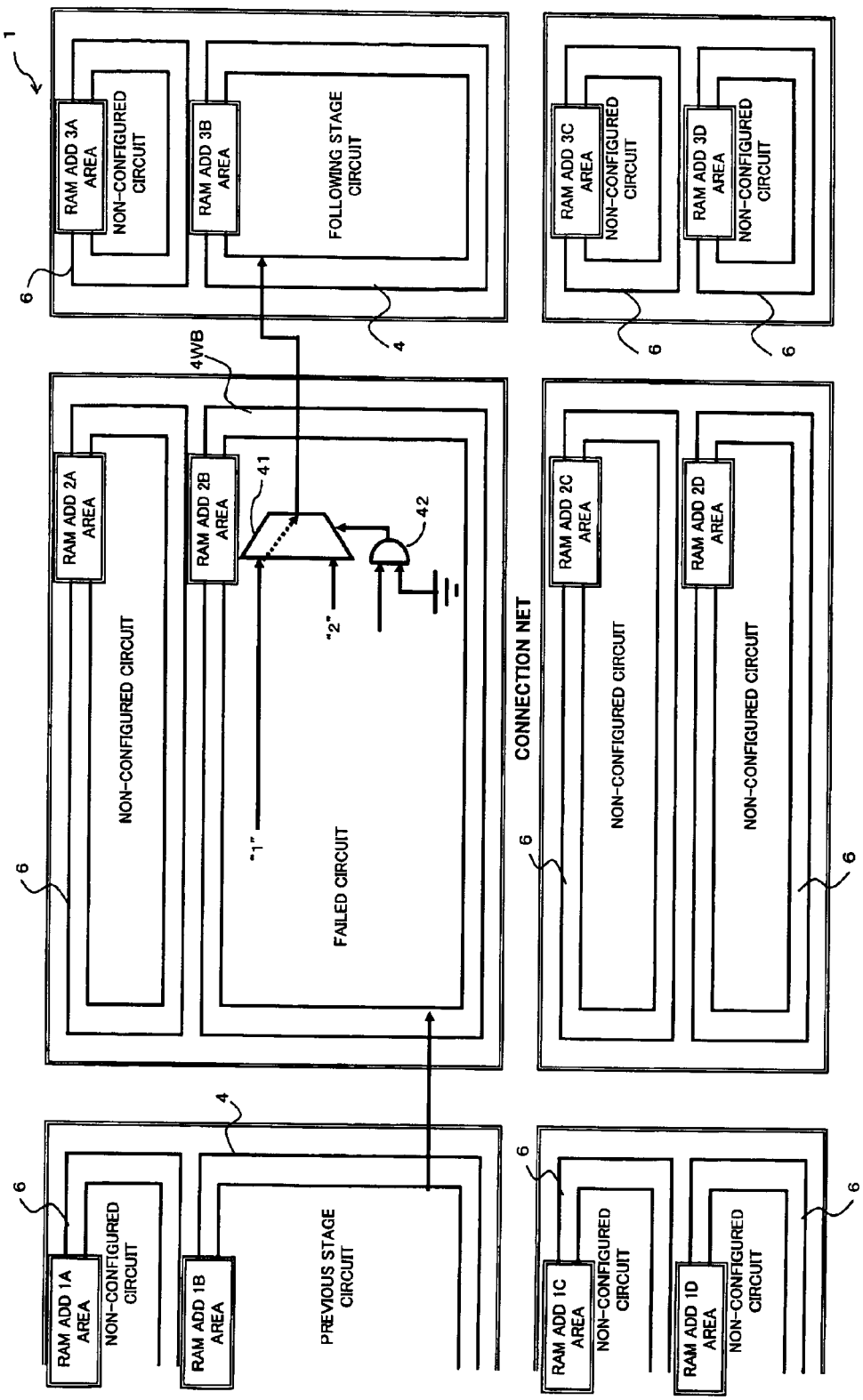
FIG. 8 is a view for describing operation (of correcting an error) of the FPGA of FIG. 7.

As shown in FIG. 8, there are provided two-inputs ("1" and "2") selector 41 and a control gate 42, which controls switching of the selector 41, at the end output stage of the failed circuit 4WB. The control gate 42 controls switching (connecting an input "1" to the output) of the selector 41 (see the broken line in FIG. 8), and one of the two inputs of the control gate 42 is grounded.

Figure 9:
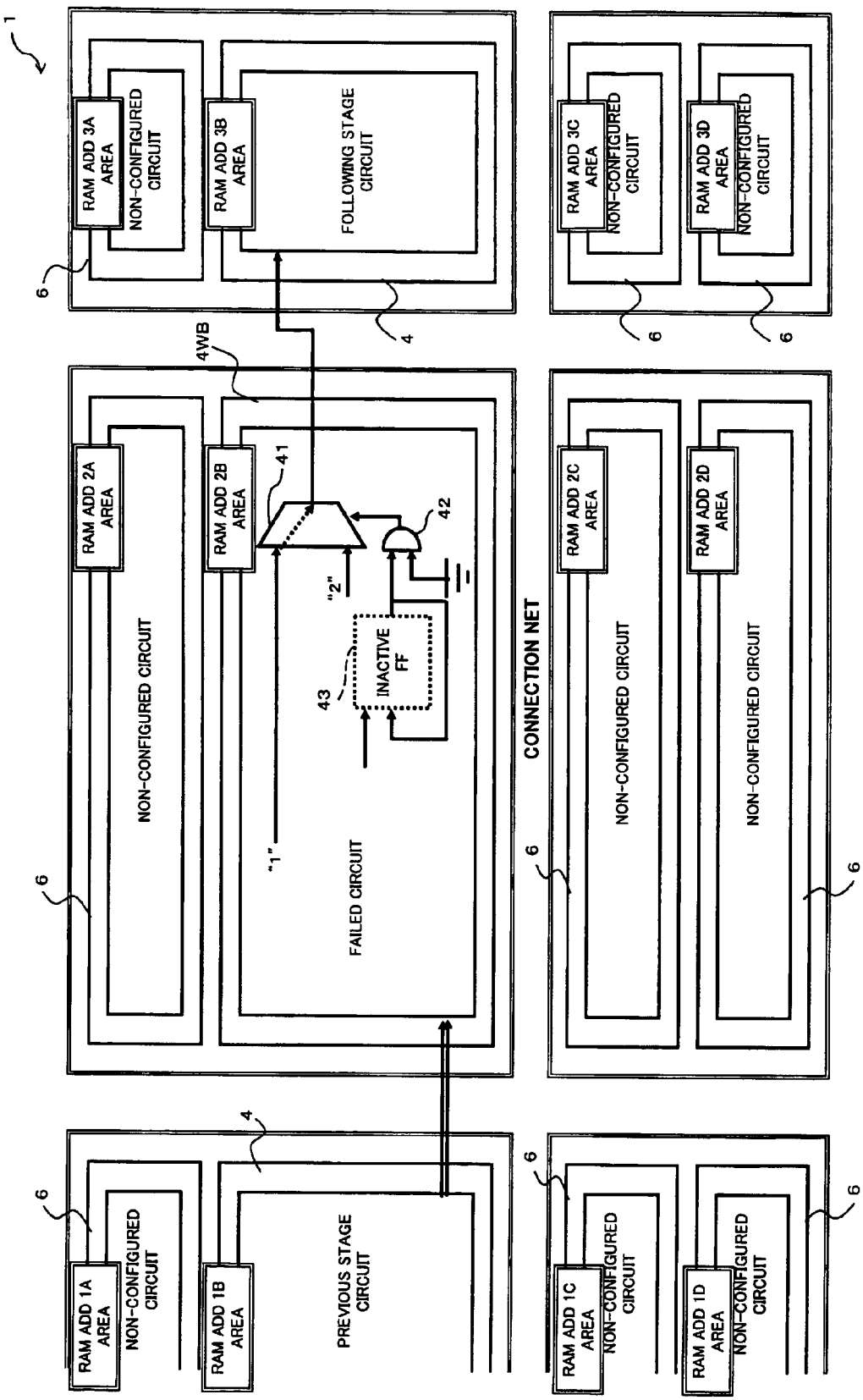
FIG. 9 is a view for describing operation (of correcting an error) of the FPGA of FIG. 7.

Under this condition, an inactivated latch (FF: Flip-Flop) 43 is interposed in the other one of the input paths of the control gate 42, as shown in FIG. 9. The address decoder 2 specifies address "2B" to overwrite the existing data therein with data for adding the inactivated latch 43, thus inserting the latch 43.

Figure 10:
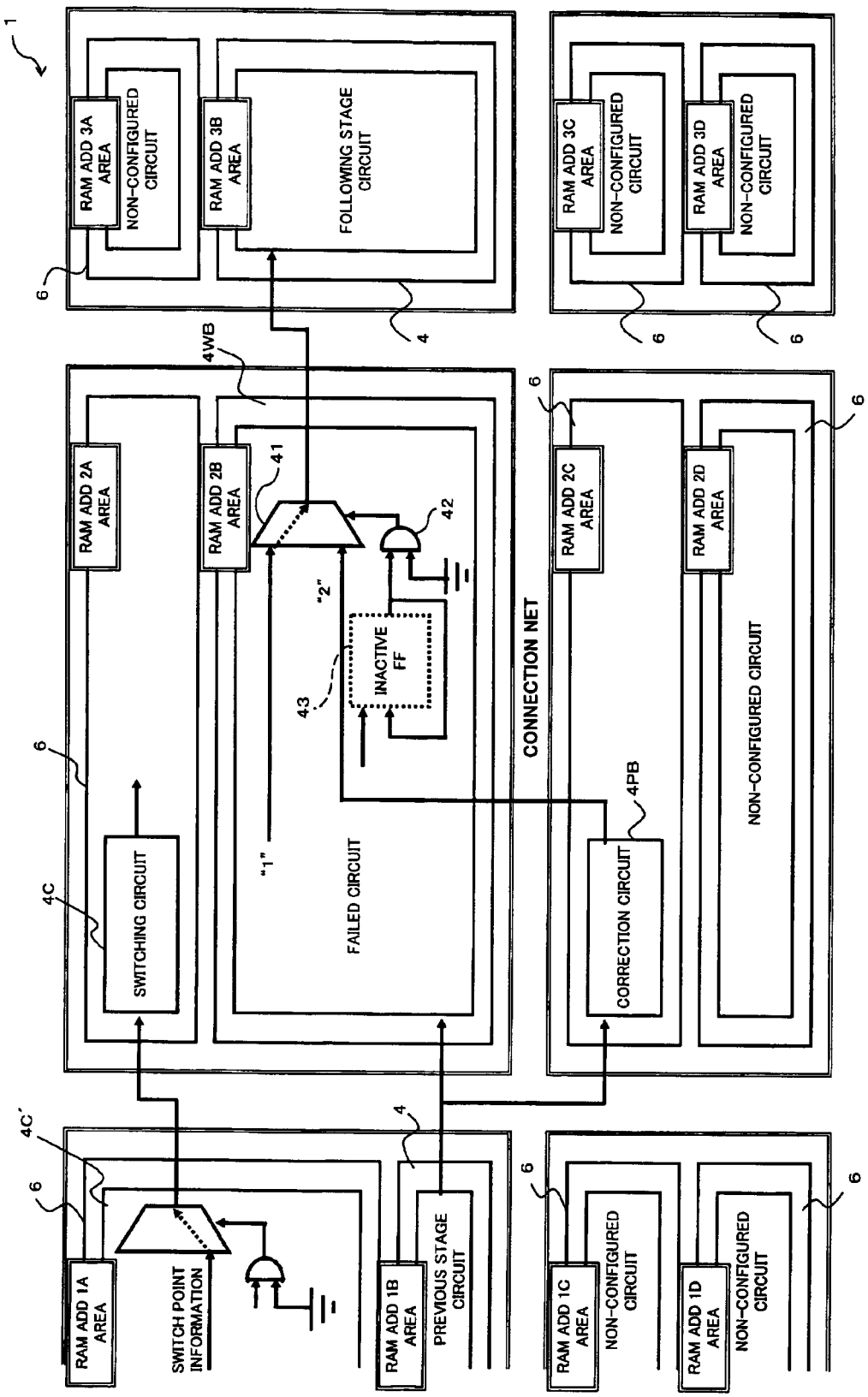
FIG. 10 is a view for describing operation (of correcting an error) of the FPGA of FIG. 7.

After that, according to the address decoder 2, address "1A" (unused area) of the memory 3 is specified to write therein data for producing switch point information, and a CLB (switch point information producing circuit) 4C' for producing switch point information is thus configured and maintained in a non-configured CLB 6 that corresponds to the address "1A," as shown in FIG. 10.

Next, according to the address decoder 2, address "2A" (unused area) of the memory 3 is specified to write therein circuit data for producing and maintaining a switching circuit 4C, and the switching circuit 4C, which is for replacing the failed circuit 4WB with the correction circuit 4PB, is thus configured and maintained in a non-configured CLB 6 that corresponds to the address "2A" of the memory 3.

After that, according to the address decoder 2, a gate configuration data area 32 (see FIGS. 3 to 6) of the memory 3 is specified to write therein data for connecting (wiring) address "1A" and address "2A," or the switch point information producing circuit 4C' and the switching circuit 4C, and the switch point information producing circuit 4C' and the switching circuit 4C are thus wired using a non-wired area.

Here, as shown in FIG. 10, the switching circuit 4C, as well as other CLBs, includes a selector 41 and a control (AND) gate 42. With the above described wiring, the above-mentioned switch point information is input to the switching circuit 4C through the selector 41, making it possible for the switching circuit 4C to identify a subject switch point (a target of switching operation; a selector 41, a control gate 42, and an inactivated latch 43, of the failed circuit 4WB).

Next, according to the address decoder 2, address "2C" (unused area) of the memory 3 is specified to write therein circuit data for configuring and maintaining a correction circuit 4PB that implements the same function as that of the failed circuit 4WB, the correction circuit 4PB is thus configured and maintained in a non-configured CLB 6 corresponding to the address "2C" of the memory 3.

After that, according to the address decoder 2, the gate configuration data area 32 of the memory 3 is specified to write therein data for connecting (wiring) address "1B" and address "2C," or the previous circuit 4, which is provided before the failed circuit 4WB, and a correction circuit 4PB, and the previous circuit 4 and the correction circuit 4PB are thus wired using a non-wired area.

Further, according to the address decoder 2, the gate configuration data area 32 of the memory 3 is specified to write therein data for connecting (wiring) address "2C" and address "2B," or the correction circuit 4PB and the failed circuit 4WB, and the correction circuit 4PB and the failed circuit 4WB are thus wired. More specifically, wiring is performed so that an input to the failed circuit 4WB also enters the correction circuit 4PB, and an output of the correction circuit 4PB enters the other input "2" of the selector 41 of the failed circuit 4WB.

Figure 11:
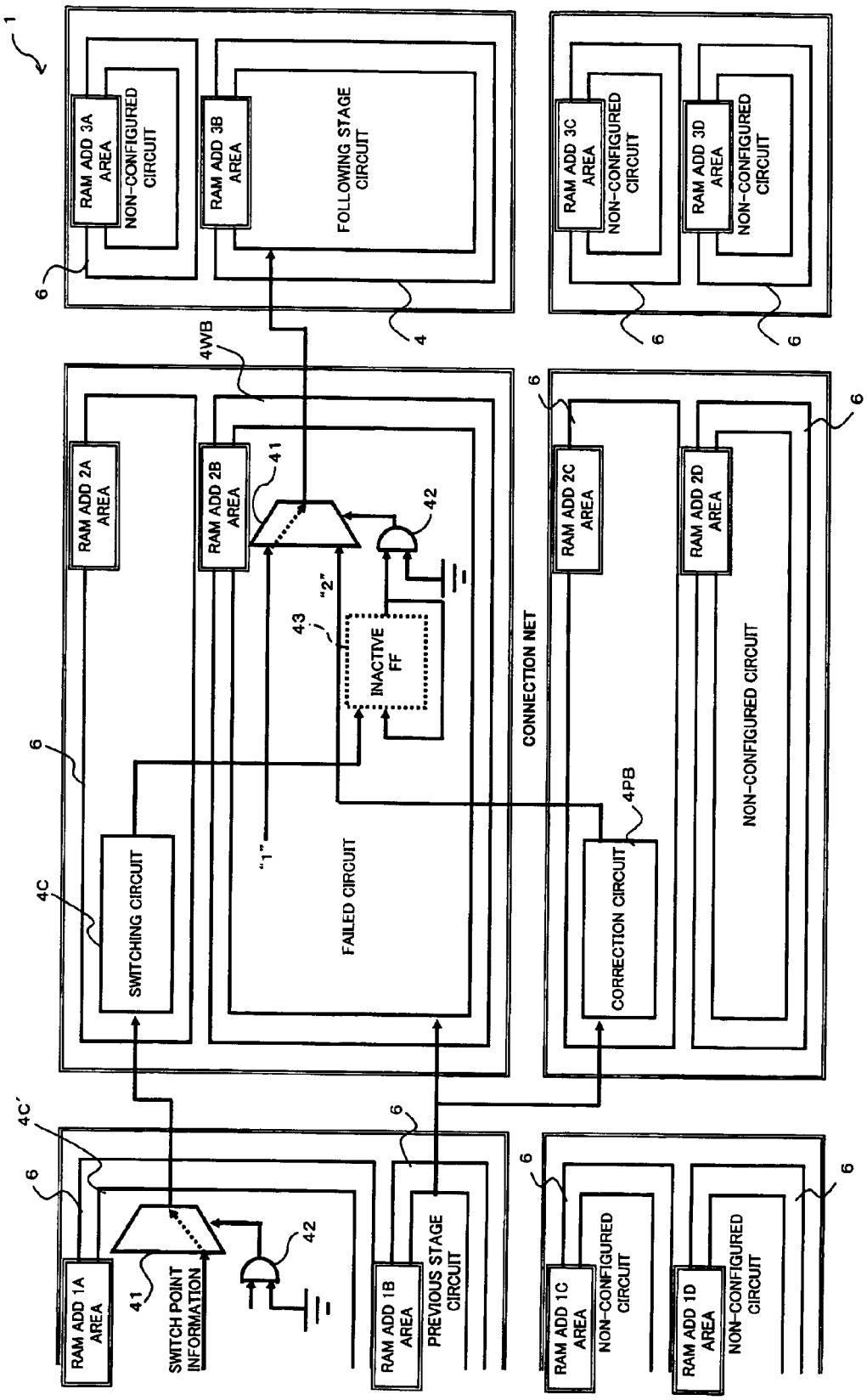
FIG. 11 is a view for describing operation (of correcting an error) of the FPGA of FIG. 7.

Subsequently, according to the address decoder 2, the gate configuration data area 32 of the memory 3 is specified to write therein data for connecting (wiring) address "2A" and address "2B," or the switching circuit 4C and the failed circuit 4WB, and the switching circuit 4C and the failed circuit 4WB are thus wired using an unwired area, as shown in FIG. 11.

At that time, the output of the switching circuit 4C is connected to the input of the latch 43 of the failed circuit 4WB to sweep a point where operation timing of the failed circuit 4WB matches that of the correction circuit 4PB. Then, according to the address decoder 2, address "2B" is specified and the control gate 42 of the failed circuit 4WB is opened (one of the inputs, which is grounded, turns into H-level), and the existing data is overwritten with data for activating the control gate 42. In this manner, the control gate 42 is opened and the latch 43 is activated.

Figure 13:
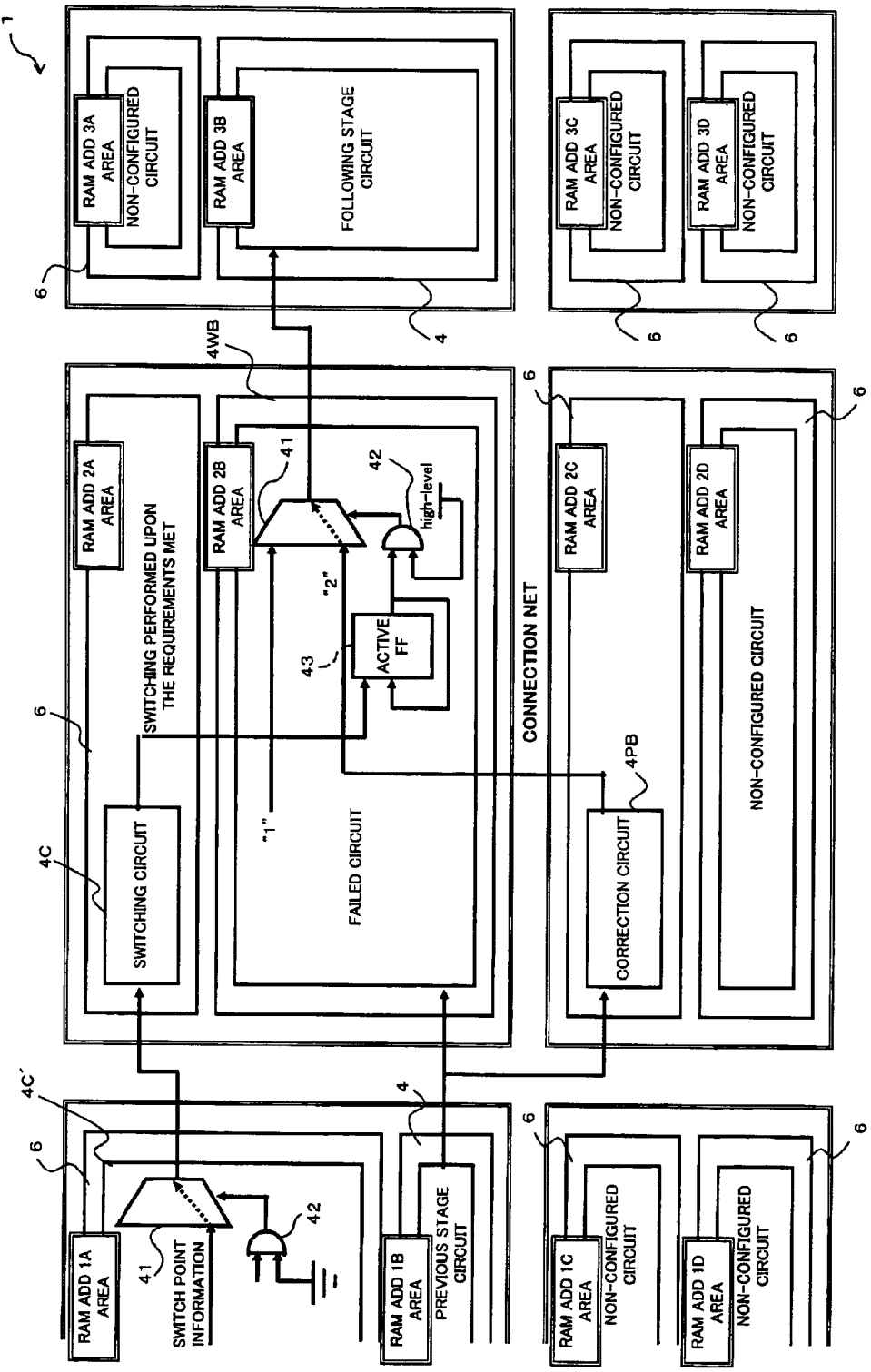
FIG. 13 is a view for describing operation (of correcting an error) of the FPGA of FIG. 7.
Figure 14:
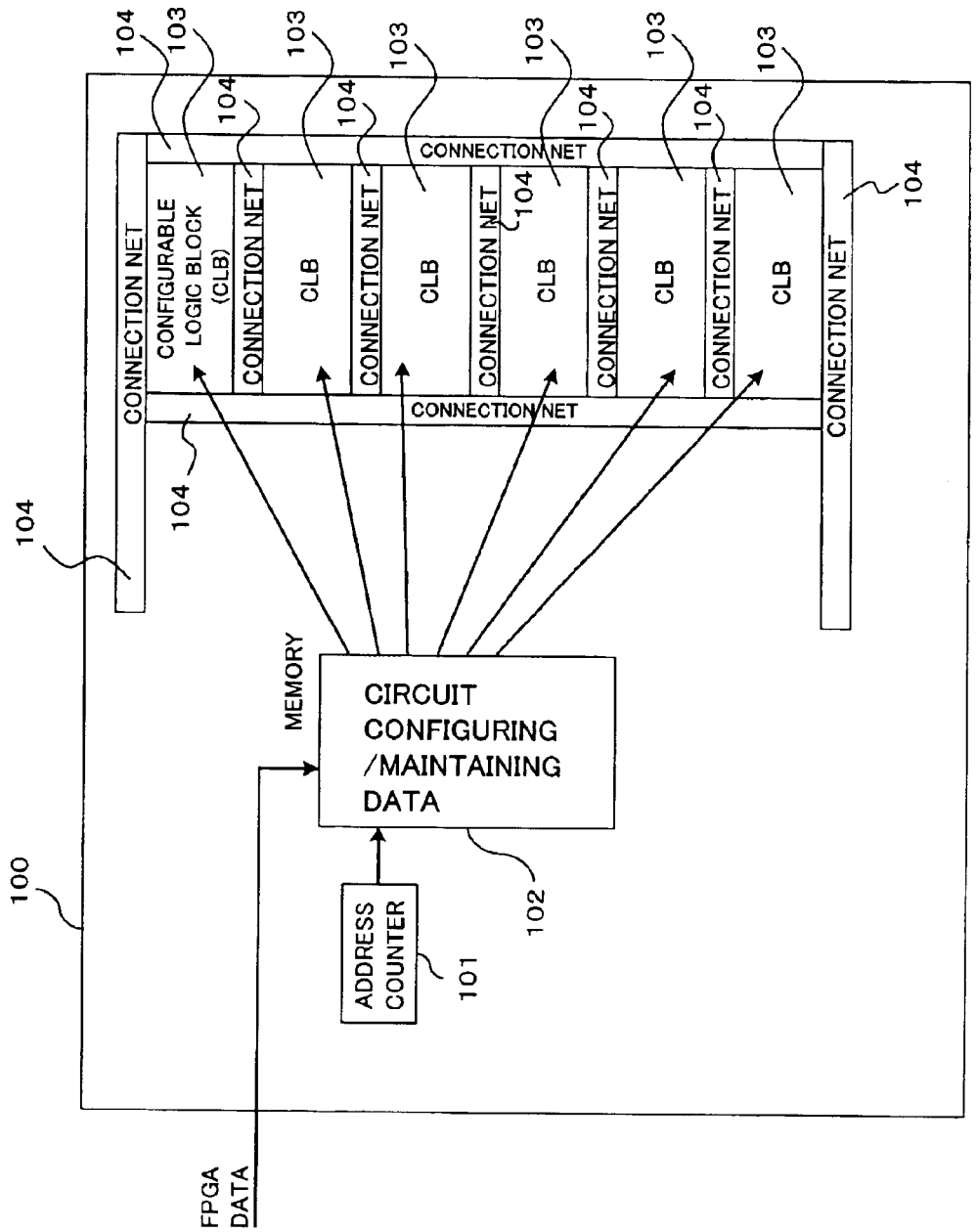
FIG. 14 is a block diagram of an FPGA as a conventionally used logic device.

With this construction, when operation timing of the failed circuit 4WB and that of the correction circuit 4PB match, the output of the control gate 42 becomes H-level, as shown in FIG. 13, and the selector 41 of the failed circuit 4WB is switched to output the output (input "2") of the correction circuit 4PB, thus replacing the failed circuit 4WB with the correction circuit 4PB.

The following table 1 shows the above-described procedures. It is to be noted that the order of configuring each BLB, described as "write order=1, 2, 3, 5," can be modified as necessary.

TABLE 1

Figure 12:
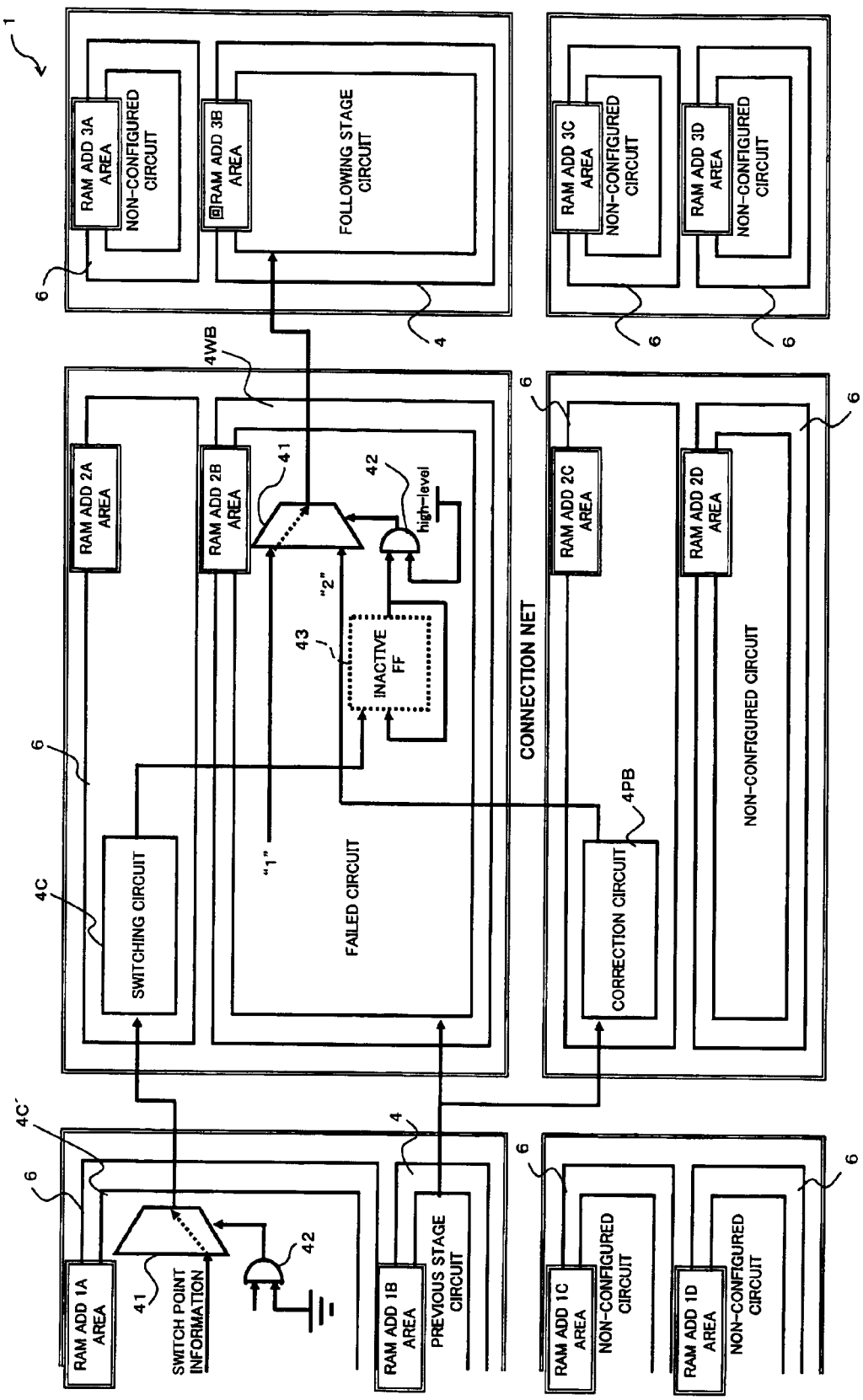
FIG. 12 is a view for describing operation (of correcting an error) of the FPGA of FIG. 7.

| Write Order | Write Address | Write Contents (Data) | Remarks | FIG. |
|---|---|---|---|---|
| 0 | — | — | With problem (before correction) | FIG. 8 |
| 1 | CLB Configuration 2B | Add an Inactivated FF | Overwriting the existing data with additional inf. | FIG. 9 |
| 2 | CLB Configuration 1A | Produce switch point inf. | Configuration in an unused area | FIG. 10 |
| 3 | CLB Configuration 2A | Configure a switching circuit | Configuration in an unused area | |
| 4 | Gate configuration data area | Connect 1A and 2A | Configuration in an unused area | |
| 5 | CLB Configuration 2C | Configure a correction circuit | Configuration in an unused area | |
| 6 | Gate configuration data area | Connect 1B and 2C | Configuration in an unused area | |
| 7 | Gate configuration data area | Connect 2C and 2B | Configuration in an unused area | |
| 8 | Gate configuration data area | Connect 2A and 2B | Configuration in an unused area | FIG. 11 |
| 9 | CLB Configuration 2B | Pull up AND for a selector | Re-overwriting 2B | FIG. 12 |
| | Completion of writing for correcting a circuit | | Switching according to a switch timing | FIG. 13 |

In this modified example, it is possible to solve problems in the FPGA 1, preventing unnecessary or unexpected signals from being sent out, without terminating operation of working CLBs. With use of this device in an exchange whose system down is never allowed, it is possible to solve such problems without terminating operation of the exchange.

It is to be noted that the present invention should by no means be limited to the above-illustrated embodiment, and various changes or modifications may be suggested without departing from the gist of the invention.

What is claimed is:

1. A logic device re-programmable without terminating operation, in the logic device a logic circuit is configured and maintained based on logic circuit configuration data for implementing a desired function, said logic device comprising:

a memory holding the logic circuit configuration data for configuring and maintaining said logic circuit; and an address controller for writing, in an unused area of said memory, logic circuit configuration data for configuring and maintaining one or more additional logic circuits without terminating operation of said logic device.

2. A logic device re-programmable without terminating operation as set forth in claim 1, wherein, in case of dissatisfactory functioning of a logic circuit, said address controller writes, in the unused memory area of said memory, logic circuit configuration data for configuring and maintaining (i) a substitute logic circuit which realizes a same function of the dissatisfactory logic circuit and (ii) a switch logic circuit for switching between the dissatisfactory logic circuit and said substitute logic circuit, as said additional logic circuits.

* * * * *